US012625189B2

(12) United States Patent
Oji

(10) Patent No.: US 12,625,189 B2
(45) Date of Patent: May 12, 2026

(54) ESTIMATION DEVICE, ESTIMATION METHOD, AND COMPUTER PROGRAM

(71) Applicant: GS Yuasa International Ltd., Kyoto (JP)

(72) Inventor: Katsuya Oji, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 501 days.

(21) Appl. No.: 17/613,754

(22) PCT Filed: May 21, 2020

(86) PCT No.: PCT/JP2020/020136
§ 371 (c)(1),
(2) Date: Nov. 23, 2021

(87) PCT Pub. No.: WO2020/241448
PCT Pub. Date: Dec. 3, 2020

(65) Prior Publication Data
US 2022/0244317 A1 Aug. 4, 2022

(30) Foreign Application Priority Data

May 24, 2019 (JP) ................................. 2019-097998

(51) Int. Cl.
*G01R 31/3835* (2019.01)
*G01R 31/367* (2019.01)
(Continued)

(52) U.S. Cl.
CPC ....... *G01R 31/3835* (2019.01); *G01R 31/367* (2019.01); *G01R 31/388* (2019.01); *G01R 31/392* (2019.01); *H01M 10/48* (2013.01)

(58) Field of Classification Search
None
See application file for complete search history.

(56) References Cited

U.S. PATENT DOCUMENTS 6,094,052 A 7/2000 Arai et al.
6,621,250 B1 9/2003 Ohkubo et al.
(Continued)

FOREIGN PATENT DOCUMENTS

CN 107015153 A 8/2017
EP 3121613 A1 1/2017
(Continued)

OTHER PUBLICATIONS

Extended European Search Report for European Patent Application No. 20815057.3, dated Jul. 15, 2022, (9 pages), European Patent Office, Munich, Germany.

(Continued)

*Primary Examiner* — Raymond L Nimox
(74) *Attorney, Agent, or Firm* — Alston & Bird LLP

(57) ABSTRACT

The estimation device 4 is provided with: a first acquisition unit 41 for acquiring SOC values obtained at the start and end of charging, discharging, or float-charging of a power storage element 3; a storage unit 42 storing multiple deterioration coefficients corresponding to multiple SOC ranges; an identification unit 41 for identifying, on the basis of the start and end SOC values acquired by the first acquisition unit 41, a corresponding deterioration coefficient from among the multiple deterioration coefficients stored in the storage unit 42; and an estimation unit 41 for estimating the deterioration of the power storage element 3 on the basis of the deterioration coefficient identified by the identification unit 41.

4 Claims, 11 Drawing Sheets

Time/day

(51) Int. Cl.
   G01R 31/388          (2019.01)
   G01R 31/392          (2019.01)
   H01M 10/48           (2006.01)

(56)                    References Cited

U.S. PATENT DOCUMENTS

| 2011/0112781 | A1 | 5/2011 | Anderson et al. | |
|---|---|---|---|---|
| 2012/0130655 | A1 | 5/2012 | Mitsuda et al. | |
| 2015/0236384 | A1 | 8/2015 | Nakayama et al. | |
| 2016/0187432 | A1 | 6/2016 | Saint-Marcoux et al. | |
| 2017/0328957 | A1* | 11/2017 | Suzuki ................. | H01M 10/48 |
| 2018/0156873 | A1 | 6/2018 | Matsuyama et al. | |

FOREIGN PATENT DOCUMENTS

| EP | 3232216 | A1 | 10/2017 |
|---|---|---|---|
| JP | H10-295044 | A | 11/1998 |
| JP | 2001-097150 | A | 4/2001 |
| JP | 2015-153656 | A | 8/2015 |
| JP | 2015-158416 | A | 9/2015 |
| JP | 6428957 | B2 | 11/2018 |
| WO | WO-2013/099401 | A1 | 7/2013 |
| WO | WO-2016/194082 | A1 | 12/2016 |

OTHER PUBLICATIONS

International Search Report for PCT/JP2020/020136 (ISA/JP) with English translation mailed Aug. 11, 2020 (5 pages).

* cited by examiner

ESTIMATION DEVICE, ESTIMATION METHOD, AND COMPUTER PROGRAM

CROSS REFERENCE TO RELATED APPLICATIONS

This application is a national stage application, filed under 35 U.S.C. § 371, of International Application No. PCT/JP2020/020136, filed May 21, 2020, which international application claims priority to and the benefit of Japanese Application No. 2019-097998, filed May 24, 2019; the contents of both of which as are hereby incorporated by reference in their entireties.

BACKGROUND

Technical Field

The present invention relates to an estimation device, an estimation method, and a computer program for estimating degradation of an energy storage device.

Description of Related Art

An energy storage device capable of storing electric energy and supplying energy as a power source when necessary is used. The energy storage device is applied to a portable instrument, a power supply device, a transportation instrument including automobiles and railways, an industrial instrument including aerospace and construction, and the like. It is important to constantly grasp a storage capacity of the energy storage device such that the energy stored as much as necessary can be used when necessary. It is known that the energy storage device is mainly chemically degraded with time and a use frequency. Thus, the energy that can be utilized decreases with time and use frequency. It is important to grasp a degradation state of the energy storage device in order to use the energy as much as necessary when necessary. A technique for estimating the degradation of the energy storage device has been developed so far.

For example, when the energy storage device is used in a wind power generation facility, the amount of power generation is frequently switched by wind power, and the pattern of the power generation is complicated, so that a charge-discharge pattern of the energy storage device is also complicated. In the case of solar power generation, for instance, because power is generated in the daytime, a substantially constant power generation pattern is provided, and the charge-discharge pattern of the energy storage device is also substantially constant. Thus, the degradation of the energy storage device can be estimated by acquiring the charge-discharge pattern for a predetermined period. Also in an on-vehicle energy storage device, the degradation of the energy storage device is estimated by acquiring the charge-discharge pattern for the predetermined period.

Patent Document WO 2013/099401 discloses a storage battery system that distributes a current from a power generation device to a plurality of storage battery blocks and distributes a constant current to at least one storage battery block, and estimates a state of charge (SOC) from a current, a voltage, and a temperature of the storage battery block to which the constant current is distributed.

BRIEF SUMMARY

In the conventional method, particularly in the case of a complicated charge-discharge pattern in which the charge-discharge is frequently switched, estimation accuracy of the degradation of the energy storage device may not be sufficient. In the storage battery system of Patent Document WO 2013/099401, the SOC can be measured by applying a constant current during a measurement time, but a degradation amount accumulated in the storage battery cannot be estimated. There is a demand for better estimation of the degradation even for the complicated charge-discharge pattern.

An object of the present invention is to provide an estimation device, an estimation method, and a computer program capable of accurately estimating the degradation of the energy storage device.

According to an aspect of the present invention, an estimation device includes: a first acquisition unit that acquires SOCs at a start and an end in charge, discharge, or floating charge of an energy storage device; a storage that stores a plurality of degradation coefficients corresponding to a plurality of SOC ranges; an identification unit that identifies a corresponding degradation coefficient from the plurality of degradation coefficients stored in the storage based on the SOCs at the start and the end acquired by the first acquisition unit; and an estimation unit that estimates degradation of the energy storage device based on the degradation coefficient identified by the identification unit.

According to another aspect of the present invention, an estimation method includes: acquiring SOCs at a start and an end in charge, discharge, or floating charge of an energy storage device; and estimating degradation of the energy storage device using a degradation coefficient previously determined from a plurality of SOC ranges based on the acquired SOCs at the start and the end.

According to still another aspect of the present invention, a computer program causing a computer to execute: acquiring SOCs at a start and an end in charge, discharge, or floating charge of an energy storage device; and estimating degradation of the energy storage device using a degradation coefficient previously determined from a plurality of SOC ranges based on the acquired SOCs at the start and the end.

In the present invention, the degradation of the energy storage device can be accurately estimated.

DETAILED DESCRIPTION OF VARIOUS EMBODIMENTS

Outline of Embodiment

Figure 1:
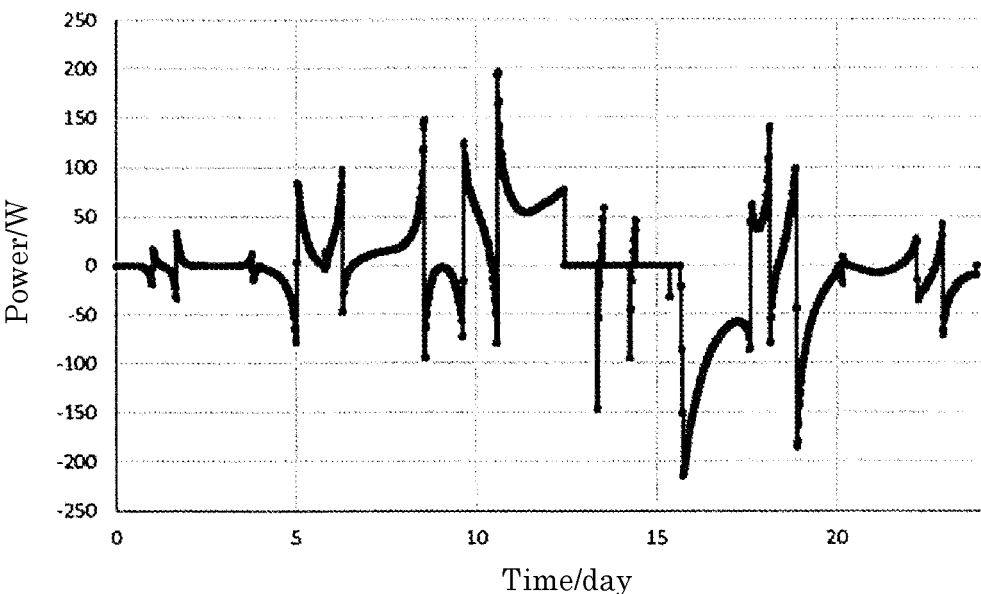
FIG. 1 is a graph illustrating an example of a charge-discharge pattern of wind power generation.

According to an aspect of the present invention, an estimation device includes: a first acquisition unit that acquires SOCs at a start and an end in charge, discharge, or floating charge of an energy storage device; a storage that stores a plurality of degradation coefficients corresponding to a plurality of SOC ranges; an identification unit that identifies a corresponding degradation coefficient from the plurality of degradation coefficients stored in the storage based on the SOCs at the start and the end acquired by the first acquisition unit (or a difference in the SOC from the start to the end); and an estimation unit that estimates degradation of the energy storage device based on the degradation coefficient identified by the identification unit.

For a series of the charge, the discharge, or the floating charge, the plurality of degradation coefficients are stored in the storage corresponding to the plurality of SOC ranges. The corresponding degradation coefficient is identified from the plurality of degradation coefficients stored in the storage based on the SOCs at the start and the end (or, the difference in the SOC from the start to the end), and the degradation of the energy storage device is estimated. Furthermore, considering the knowledge of Japanese Patent No. 6428957 of the present applicant (i.e., the degradation amount is large when the fluctuation amount of the SOC around the predetermined SOC is large, and the degradation value changes depending on the center SOC even when the fluctuation amount of the SOC is the same), the degradation is estimated by batch processing. The degradation coefficient corresponding to ΔSOC and the SOC range is used for each time of the charge and the discharge. The degradation of the energy storage device can be accurately estimated even in the case of the complicated charge-discharge pattern in which the charge-discharge is frequently switched. In addition, effects that a calculation load of a processor is reduced, the processing of the processor can be sped up, or an inexpensive processor can be used instead of an expensive processor capable of performing high-speed processing can be obtained by performing the batch processing.

In the estimation device described, the storage may store the plurality of degradation coefficients corresponding to the plurality of SOC ranges obtained by dividing SOC of 0 to 100% at different intervals, and the identification unit may identify the degradation coefficient in the SOC range including the SOCs at the start and the end acquired by the first acquisition unit and having a smallest range width in the plurality of SOC ranges.

According to the above configuration, the degradation coefficient can be well identified.

The estimation device further includes a second acquisition unit that acquires a change amount of current, voltage, power, or an SOC in a unit time. The first acquisition unit may acquire the SOC based on the change amount of the current, the voltage, the power, or the SOC acquired by the second acquisition unit and the change amount of the current, the voltage, the power, or the SOC previously acquired by the second acquisition unit.

According to the above configuration, a transition of a state can be detected based on the change amount of the current, the voltage, the power, or the SOC in the unit time.

The estimation device further includes a first determination unit that determines presence or absence of switching from leaving to charge-discharge or switching between charge-discharge based on the change amount of the current, the voltage, the power, or the SOC acquired by the second acquisition unit and the change amount of the current, the voltage, the power, or the SOC previously acquired by the second acquisition unit. The first acquisition unit may acquire the SOC when the first determination unit determines that the switching is performed.

According to the above configuration, the switching of the charge-discharge can be checked, the SOCs at the start and the end of the charge or the discharge can be acquired, and the degradation can be well estimated for each of the charge and the discharge.

The estimation device further includes a second determination unit that determines whether a state is a charge-discharge state, a leaving state, or a floating state based on a change amount of current, voltage, power, or an SOC for a unit time acquired by the second acquisition unit. The estimation unit may estimate the degradation based on the state determined by the second determination unit.

According to the above configuration, the degradation can be well estimated depending on the state of the energy storage device.

According to another aspect of the present invention, an estimation method includes: acquiring SOCs at a start and an end in charge, discharge, or floating charge of an energy storage device (or a difference in the SOC from the start to the end); and estimating degradation of the energy storage device using a degradation coefficient previously determined from a plurality of SOC ranges based on the acquired SOCs at the start and the end.

According to the above configuration, the degradation of the energy storage device is estimated using the degradation coefficient previously determined from the plurality of SOC ranges based on the SOCs at the start and the end (or, the difference in the SOC from the start to the end). The degradation is estimated by the batch processing using the degradation coefficient corresponding to the ΔSOC and the SOC range each time of the charge and the discharge. The degradation of the energy storage device can be accurately estimated even in the case of the complicated charge-discharge pattern in which the charge-discharge is frequently switched.

According to still another aspect of the present invention, a computer program causing a computer to execute: acquiring SOCs at a start and an end in charge, discharge, or floating charge of an energy storage device (or a difference in the SOC from the start to the end); and estimating degradation of the energy storage device using a degradation coefficient previously determined from a plurality of SOC ranges based on the acquired SOCs at the start and the end.

In the above, the estimation of the degradation of the energy storage device using the SOC has been described. However, the degradation can be similarly estimated from capacity of the energy storage device, namely, the capacity of the energy storage device at the start and the end of the charge, the discharge, or the floating charge of the energy storage device. Hereinafter, the estimation of the degradation of the energy storage device using the SOC will be described as an example.

A degradation estimation method will be specifically described below.

FIG. 1 is a graph illustrating an example of the charge-discharge pattern of wind power generation. In FIG. 1, a horizontal axis represents time (day), and a vertical axis represents power (W). As illustrated in FIG. 1, because an amount of power generation of the wind power generation is finely changed by wind power, the charge and the discharge are switched in a short period, and a complicated pattern is generated.

Figure 2:
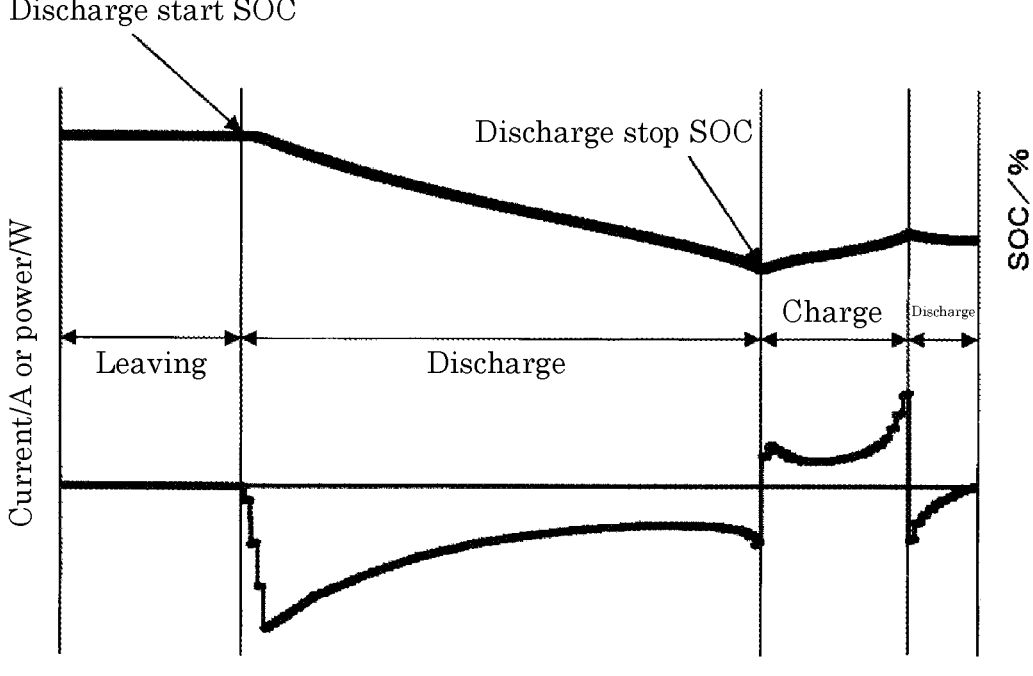
FIG. 2 is a partially enlarged view of FIG. 1.

FIG. 2 is a partially enlarged view of FIG. 1. In FIG. 2, the horizontal axis represents time (day), the right vertical axis represents SOC (%), and the left vertical axis represents power (W). The left vertical axis also corresponds to current (A). As illustrated in FIG. 2, the SOC and the power transition to the leaving state in which the SOC and the power are constant, a discharge state in which the SOC decreases and the power indicates a negative value, and a charge state in which the SOC increases and the power indicates a positive value. Although not illustrated in FIG. 2, there is also the floating state in which a minute current flows through a bypass circuit after full charge so as not to apply a load to the energy storage device.

In the wind power generation facility, output fluctuation of the wind power generation is large when limited to one point, but the output fluctuation is moderated by an averaging effect when a plurality of points are overlapped.

For example, millions of energy storage devices are used in one wind power generation facility, and there is also a demand for accurately estimating the degradation and accurately determining the number of energy storage devices replaced or added after several years.

The degradation needs to be accurately estimated in response to a frequent change in the charge-discharge in consideration of the averaging effect.

As disclosed in Japanese Patent No. 6428957, the present applicant found that the degradation amount is different when the fluctuation amount of the SOC is different even if the center SOC of the charge-discharge is the same. The present applicant found that the degradation amount increases depending on the fluctuation magnitude of the SOC.

The present applicant also found that the degradation amount greatly varies depending on the center SOC even when the fluctuation amount of the SOC is the same.

The present applicant has developed various degradation estimation methods in consideration of the degradation of a negative active material.

In Japanese Patent No. 6428957, the present applicant considered a possibility that as the fluctuation magnitude of the SOC increases, expansion (during the charge) and contraction (during the discharge) of the negative electrode become significant, so that the SEI film formed on the surface of the negative electrode is partially destroyed, and the degradation amount of the energy storage device due to energization increases as a result.

In order to increase the amount of current in an energy storage device for a wind power generation facility, NCM (Ni+Co+Mn-based mixed positive active material, hereinafter referred to as NCM) having a large amount of Ni, represented by $Li_x(Ni_aCo_cMn_b)O_2$ (a+b+c=1, a≥0.5, b≥0, c≥0, 0<x≤1.1), is often used as a positive active material. When the fluctuation amount of the SOC is large, an active material layer of the positive electrode is likely to crack due to a change in a crystal lattice of the NCM caused by insertion/extraction of a Li ion. Isolation of the active material due to the crack increases a cut portion of the conductive path and increases a contact resistance. Accordingly, the function as the energy storage device is degraded as the number of times of the charge-discharge (the number of cycles) increases. That is, not only the above-described degradation of the negative active material but also the degradation of the positive active material need to be considered.

In the embodiment, for each rate and temperature, a plurality of degradation coefficients are stored corresponding to the SOC range from the start to the end of one series of the charge or the discharge and the ΔSOC that is the difference (range) between the SOC at the start and the SOC at the end. The corresponding degradation coefficient is identified from the stored degradation coefficients based on the acquired SOC range (start to end) of the continuous charge or discharge and the ΔSOC. The present inventor found that when the degradation is estimated using the degradation coefficient identified as described above, the degradation can be accurately estimated in response to the frequent change in the charge-discharge in consideration of the degradation derived from the active materials of the positive electrode and the negative electrode and the averaging effect, and completed the present invention.

In the embodiment, it is determined whether the state is the charge-discharge state, the leaving state, or the floating state based on the change amount of the current, the power, or the SOC. A degradation amount D is calculated by the following equation depending on the determined state.

In the case of the charged state or the discharged state, the degradation amount is calculated by the following equation (1).

$$D=Dcal+Dcyc \tag{1}$$

Here, Dcal represents a time dependent degradation amount.

Dcyc represents degradation amount due to charge-discharge.

Dcal is calculated by the following equation (2).

$$Dcal=kc×\sqrt{t} \tag{2}$$

Here, t represents elapsed time of the state.
kc represents time degradation coefficient.

The degradation model rule may be a root rule, a linear rule, or other degradation model rules.

Dcyc is calculated by the following equation (3).

$$Dcyc = kr \times \Delta SOC \qquad (3)$$

Here, kr represents a degradation coefficient during charge-discharge.

kr is identified as described later.

The degradation model rule may be a root rule, a linear rule, or other degradation model rules.

In the case of the leaving state, the degradation amount is calculated by the following equation (4).

$$D = Dcal \qquad (4)$$

When $\Delta SOC > 0$ in the floating state, the degradation amount is calculated by the following equation (5).

$$D = Dcal + Dcyc + Dflt \qquad (5)$$

Dflt is the degradation amount in the floating state, and is calculated by the following equation (6).

$$Dflt = kf \times \sqrt{t} \qquad (6)$$

Here, kf represents a degradation coefficient at the float time t.

When $\Delta SOC = 0$ in the floating state, the degradation amount is calculated by the following equation (7).

$$D = Dcal + Dflt \qquad (7)$$

Dcal and Dflt are obtained by the root rule, and Dcyc is obtained by the linear rule. However, this is an example, Dcal and Dflt may be obtained by the linear rule, and Dcyc may be obtained by the root rule.

In the embodiment, the root rule is used in the floating state, but the degradation model law may be a linear rule or another degradation model rule.

A degradation coefficient kr is identified as follows.

Figure 3:
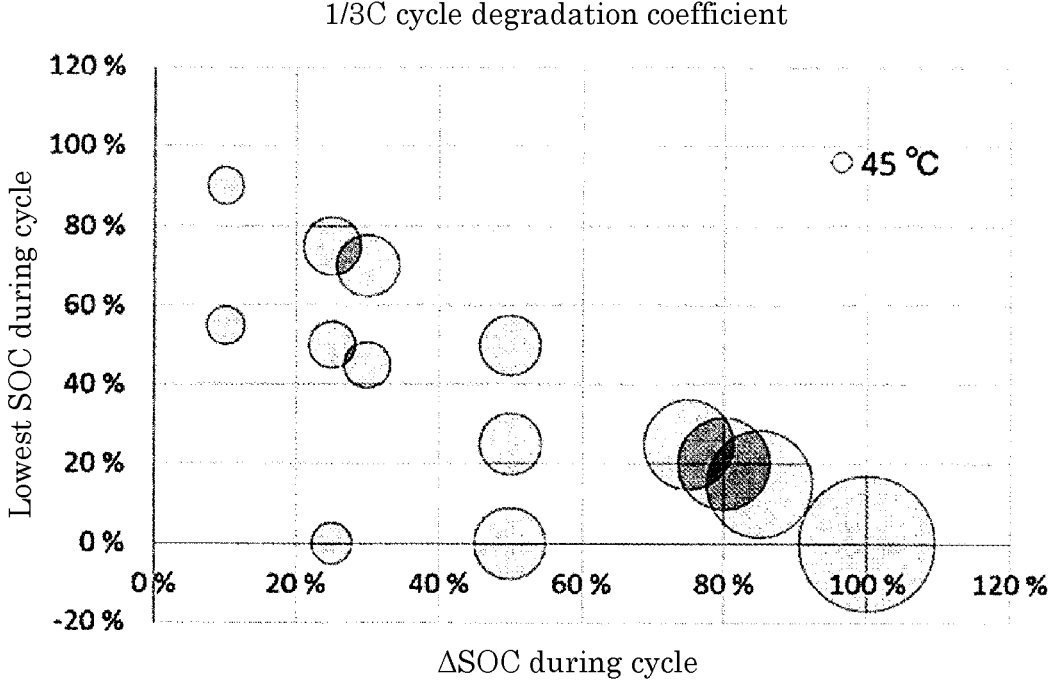
FIG. 3 is a graph illustrating a relationship between the lowest SOC and ΔSOC and a degradation coefficient when a rate is 1/3C and a temperature is 45° C.

A relationship between the $\Delta SOC$ and a state of health (SOH) is obtained by changing a start point and an end point of the charge or the discharge for each rate and temperature, and the degradation coefficient kr is obtained for each start point of the charge (corresponding to the minimum SOC of the charge-discharge and the SOC range from the start to the end) and the $\Delta SOC$. FIG. 3 is a graph illustrating a relationship between the lowest SOC and $\Delta SOC$ and the degradation coefficient kr when a rate is 1/3C and a temperature is 45° C. In FIG. 3, the horizontal axis represents the $\Delta SOC$ (%), the vertical axis represents the lowest SOC (%) of the charge-discharge, and a size of a circle at each point represents the value of the degradation coefficient kr.

Figure 4:
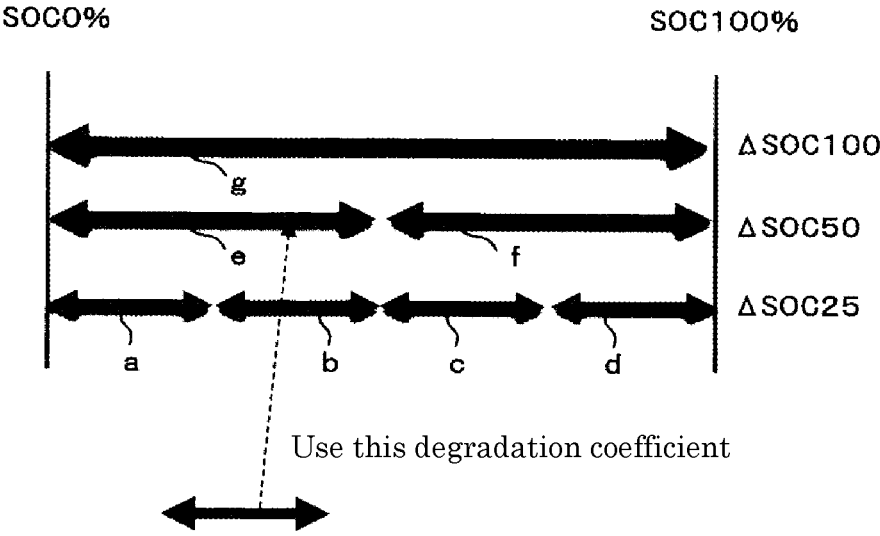
FIG. 4 is an explanatory view illustrating a method for identifying the degradation coefficient.

FIG. 4 is an explanatory view illustrating a method for identifying the degradation coefficient. A horizontal direction in FIG. 4 is SOC (%). Based on the result in FIG. 3, the degradation coefficient kr is given for each $\Delta SOC$. In the case of the $\Delta SOC$ 25, a, b, c, d are given as the degradation coefficients kr corresponding to the start point and the end point of the charge (or) the discharge. In the case of the $\Delta SOC$ 50, e, f are given as the degradation coefficients kr. In the case of the $\Delta SOC$ 100, g is given as the degradation coefficient kr.

As illustrated in the example of FIG. 4, when the acquired SOC range is 10% to 30%, the degradation coefficient kr including the entire SOC range of 10% to 30% and having the smallest $\Delta SOC$ (SOC range width) is selected. In this case, the degradation coefficient e of the $\Delta SOC50$ is selected.

The stored $\Delta SOC$ is not limited to 25%, 50%, and 100%. The degradation coefficient may be obtained by interpolation calculation.

In addition, the arrows in FIG. 4 may be provided by dividing the SOC range of 100% at equal intervals or not at equal intervals (the arrows may overlap) in each $\Delta SOC$. The interval may be changed depending on the SOC.

First Embodiment

Hereinafter, an example of a charge-discharge system used in a wind power generation facility will be described as first embodiment.

Hereinafter, a case where the energy storage device is a lithium-ion secondary battery will be described, but the energy storage device is not limited to the lithium-ion secondary battery.

Figure 5:
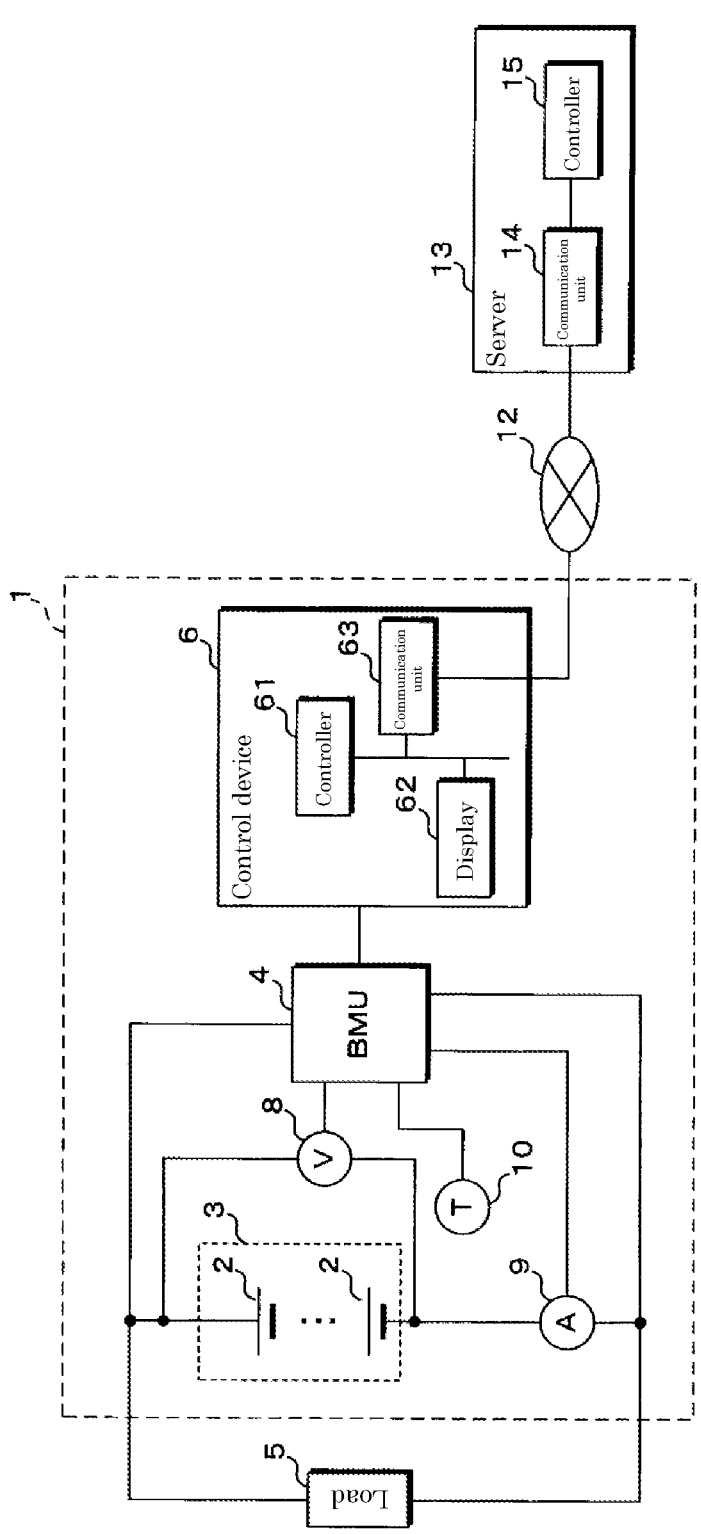
FIG. 5 is a block diagram illustrating a configuration of a charge-discharge system and a server according to a first embodiment.

FIG. 5 is a block diagram illustrating a configuration of a charge-discharge system 1 and a server 13 of first embodiment.

The charge-discharge system 1 includes a battery module 3, a battery management unit (BMU) 4, a control device 6, a voltage sensor 8, a current sensor 9, and a temperature sensor 10. The charge-discharge system 1 supplies power to a load 5.

In the battery module 3, lithium-ion secondary batteries (hereinafter, referred to as a battery) 2, a plurality of energy storage devices, are connected in series. The control device 6 controls the entire charge-discharge system 1.

The server 13 includes a communication unit 14 and a controller 15.

The control device 6 includes a controller 61, a display 62, and a communication unit 63.

The control device 6 is connected to the controller 15 through a communication unit 63, a network 12, and the communication unit 14. The control device 6 transmits and receives data to and from the controller 15 through the network 12.

In the embodiment, any one of the BMU 4, the control device 6, and the controller 15 functions as the estimation device of the present invention. When the controller 15 does not function as the estimation device, the charge-discharge system 1 may not be connected to the server 13.

FIG. 5 illustrates the case where one set of battery modules 3 is provided. The number of battery modules is not limited to this case.

The BMU 4 may be a battery ECU.

The voltage sensor 8 is connected in parallel to the battery module 3, and outputs a detection result corresponding to the entire voltage of the battery module 3. The voltage sensor 8 is connected to a terminal 23 of the positive electrode and a terminal 26 of the negative electrode described later, measures voltage $V_1$ between the terminals 23, 26 of each battery 2, and detects voltage V between a lead 33 of the negative electrode and a lead 36 of the positive electrode described later, the voltage V at the battery module 3 being a total value of Vi of the batteries 2.

The current sensor 9 is connected in series to the battery module 3, and detects current I flowing through the battery module 3.

The temperature sensor 10 detects a temperature near the battery module 3.

Figure 6:
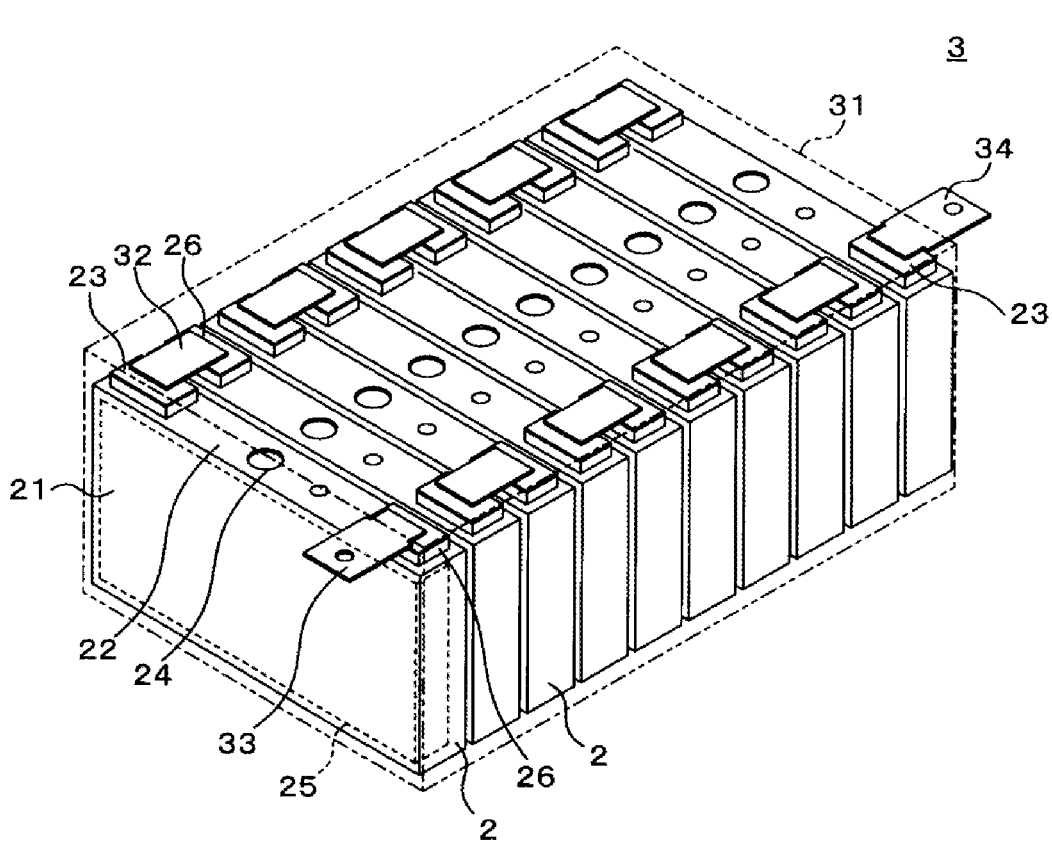
FIG. 6 is a perspective view illustrating a battery module.

FIG. 6 is a perspective view illustrating the battery module 3.

The battery module 3 includes a rectangular parallelepiped case 31 and a plurality of the batteries 2 accommodated in the case 31.

The battery 2 includes a rectangular parallelepiped case body 21, a lid plate 22, terminals 23, 26 provided on the lid plate 22, a rupture valve 24, and an electrode body 25. The electrode body 25 is formed by stacking a positive electrode plate, a separator and a negative electrode plate, and is accommodated in the case body 21.

The electrode body 25 may be obtained by winding the positive electrode plate and the negative electrode plate in a flat shape with the separator interposed therebetween.

For example, the positive electrode plate is formed by forming the active material layer on a positive electrode substrate foil that is a plate-like (sheet-like) or elongated strip-like metal foil made of aluminum, an aluminum alloy or the like. The negative electrode plate is, for instance, formed by forming the active material layer on a negative electrode substrate foil that is a plate-like (sheet-like) or elongated strip-like metal foil made of copper, a copper alloy or the like. For example, the separator is a microporous sheet made of a synthetic resin.

The positive active material used for the active material layer of the positive electrode is, for example, a layered oxide represented by $Li_x(Ni_aMn_bCo_cM_d)O_2$ (M is a metal element other than Li, Ni, Mn, Co, $0 \leq a \leq 1$, $0 \leq b < 1$, $0 \leq c < 1$, a+b+c+d=1, $0 < x \leq 1.1$, and a, c are not 0 at the same time). The positive active material has a layer rock salt-type crystal structure. It is preferable that a satisfies $0.5 \leq a \leq 1$. In this case, the transition metal site contains a large amount of Ni.

The positive active material is preferably NCM represented by $Li_x(Ni_aCo_cMn_b)O_2$ with d=0 (a+b+c=1, $a \geq 0.5$, $b \geq 0$, $c \geq 0$, $0 < x \leq 1.1$). More preferably a is greater than or equal to 0.6, and still more preferably a is greater than or equal to 0.8.

The positive active material may be NCA represented by $Li_x(Ni_aCo_cAl_d)O_2$ in which M is Al and b=0 (a+c+d=1, $a \geq 0.5$, $c \geq 0$, $d \geq 0$, $0 < x \leq 1.1$). More preferably a is greater than or equal to 0.6, and still more preferably a is greater than or equal to 0.8.

In NCM or NCA, the metal other than Li and Ni is not limited to two kinds of metals, but may be made of at least three kinds of metals. For example, a small amount of Ti, Nb, B, W, Zr, Ti, or Mg may be contained.

Examples of the positive active material include Li-excess active materials such as a $LiMeO_2$—$Li_2MnO_3$ solid solution, a $Li_2OLiMeO_2$ solid solution, a $Li_3NbO_4$—$LiMeO_2$ solid solution, a $Li_4WO_5$—$LiMeO_2$ solid solution, a $Li_4TeO_5$—$LiMeO_2$ solid solution, a $Li_3SbO_4$—$LiFeO_2$ solid solution, a $Li_2RuO_3$—$LiMeO_2$ solid solution, and a $Li_2RuO_3$—$Li_2MeO_3$ solid solution.

The case of using NCM in which Ni:Co:Mn is 5:2:3 as the positive active material will be described below.

Examples of the negative active material used for the negative active material layer include hard carbon, metals such as Si, Sn, Cd, Zn, Al, Bi, Pb, Ge, Ag or alloys thereof, or chalcogenides containing these. SiO can be cited as an example of the chalcogenide.

The adjacent terminals 23, 26 of adjacent batteries 2 of battery module 3 have different polarities, and the terminals 23, 26 are electrically connected to each other by a bus bar 32, so that the plurality of batteries 2 are connected in series.

Leads 34, 33 that extract the power are provided at the terminals 23, 26 of the batteries 2 at both ends of the battery module 3 having different polarities.

Figure 7:
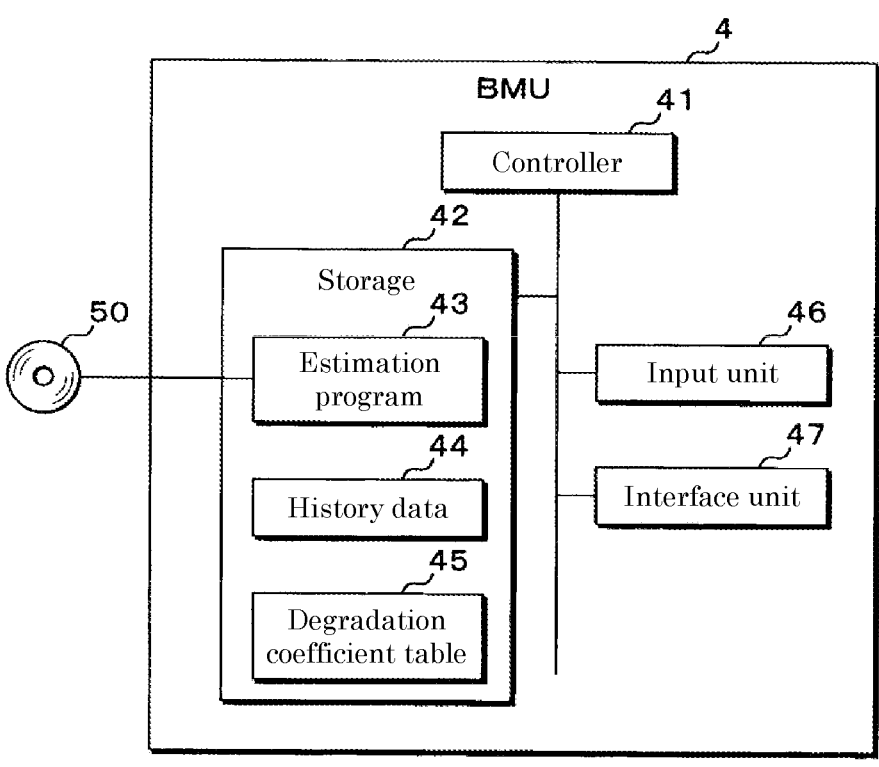
FIG. 7 is a block diagram illustrating a configuration of a battery management unit (BMU).

FIG. 7 is a block diagram illustrating a configuration of the BMU 4. The BMU 4 includes a controller 41, a storage 42, an input unit 46, and an interface unit 47. These units are communicably connected to each other through a bus. In the embodiment, the controller 41 functions as a first acquisition unit, a second acquisition unit, an identification unit, a first determination unit, and a second determination unit.

The input unit 46 receives inputs of detection results from the voltage sensor 8, the current sensor 9, and the temperature sensor 10. The interface unit 47 includes, for example, a LAN interface and a USB interface, and communicates with other devices such as the control device 6 in a wired or wireless manner.

The storage 42 includes, for example, a hard disk drive (HDD), and stores various programs and data. For example, the storage 42 stores an estimation program 43 executing a degradation estimation processing described later. The estimation program 43 is provided while stored in a computer-readable recording medium 50 such as a CD-ROM, DVD-ROM, and USB memory, and is stored in the storage 42 by installing the estimation program 43 in the BMU 4. Alternatively, the estimation program 43 may be acquired from an external computer (not illustrated) connected to a communication network, and stored in the storage 42.

The storage 42 also stores charge-discharge history data 44. The history of the charge-discharge is an operation history of the battery module 3, and is information including information indicating a period (use period) during which the battery module 3 performs the charge or the discharge, information about the charge or the discharge performed by the battery module 3 during the use period, and the like. The information indicating the use period of the battery module 3 is information including the start and end points of the charge or the discharge, an accumulated service period in which the battery module 3 is used, and the like. The information about the charge or the discharge performed by the battery module 3 is information indicating the voltage, the rate, and the like during the charge or the discharge performed by the battery module 3.

The storage 42 also stores a degradation coefficient table 45 that stores the degradation coefficients kr obtained by previous experiments for each of a plurality of ΔSOC and SOC ranges in each rate and temperature. The degradation coefficient table 45 may be updated by a conventional method as appropriate. The degradation coefficient table 45 is not limited to the case where the degradation coefficient table is stored for each rate and temperature. Instead of the SOC range, the degradation coefficient kr may be stored by associating the SOC at the start time point, the end time point, or the center time point of the charge-discharge with the ΔSOC.

The storage 42 also stores the above-described time dependent degradation coefficient kc and the degradation coefficient kf during the floating for each rate and temperature. The time dependent degradation coefficient kc and the degradation coefficient kf during the floating may be constant values.

The controller 41 includes a central processing unit (CPU), a read only memory (ROM), a random access memory (RAM), and the like, and controls the operation of the BMU 4 by executing a computer program such as the estimation program 43 read from the storage 42. The controller 41 functions as a processing unit that executes degradation estimation processing by reading and executing the estimation program 43.

Figure 8:
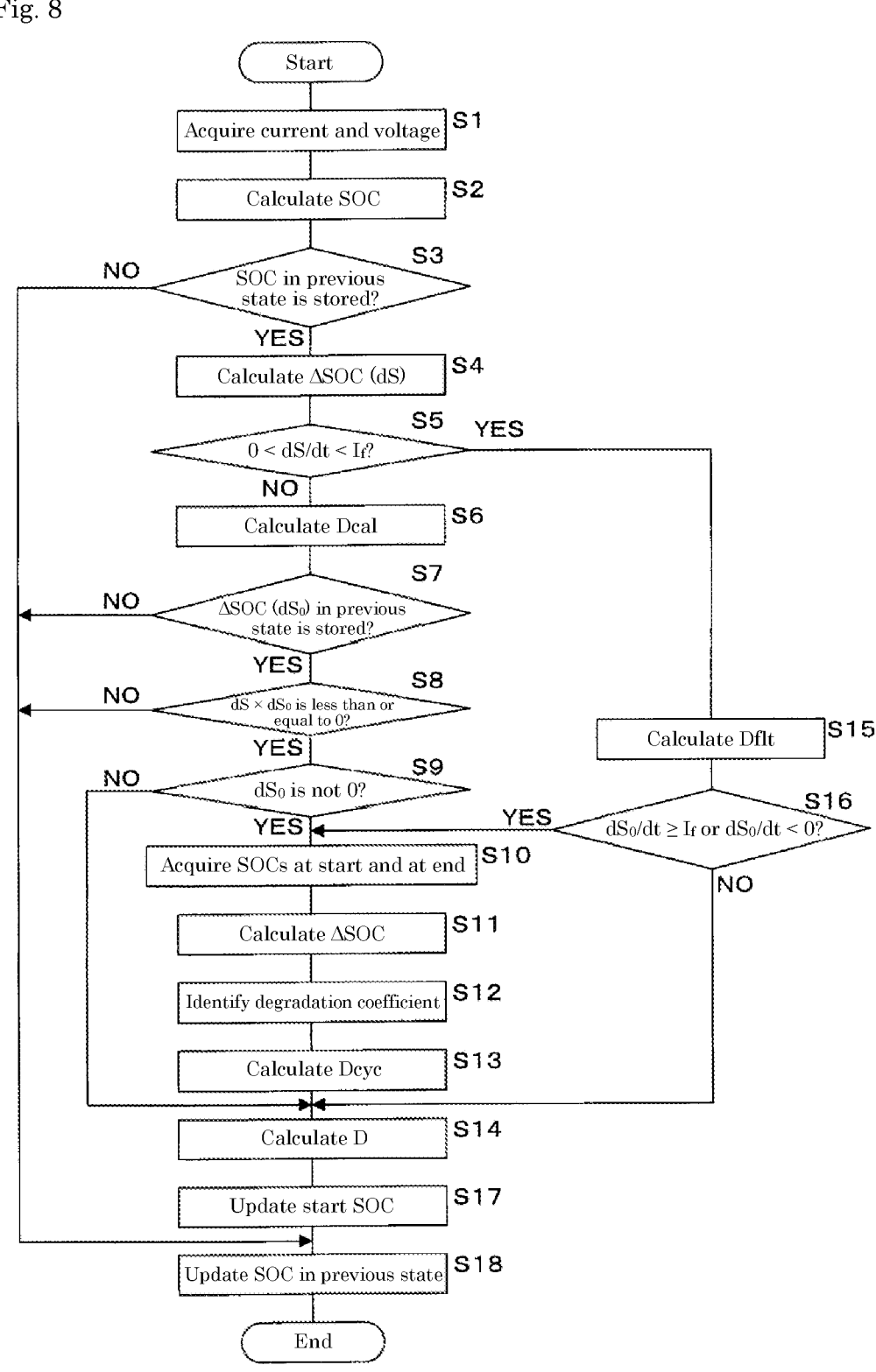
FIG. 8 is a flowchart illustrating a processing procedure of an estimation device estimating degradation of an energy storage device.

FIG. 8 is a flowchart illustrating a processing procedure of the BMU 4, the estimating device, estimating the degradation of the energy storage device.

The controller 41 acquires the current I and the voltage V (S1).

The controller 41 calculates the SOC (S2). For example, the controller 41 calculates the SOC based on the acquired V and the SOC-OCV curve.

The controller 41 determines whether the SOC in the previous state is stored (S3).

When determining that the SOC of the previous state is stored (YES in S3), the controller 41 calculates the ΔSOC (dS) of the current state (S4). For example, the controller 41 calculates ΔSOC (dS) from the current I and the elapsed time. When the SOC in the previous state is stored, a difference between the SOC in the current state and the SOC in the previous state is calculated.

The controller 41 determines whether $0<dS/dt<I_f$ is satisfied (S5). dS/dt corresponds to I. $I_f$ is a current threshold determining whether the floating state is established. When the controller 41 determines that $0<dS/dt<I_f$ is satisfied (YES in S5), the processing proceeds to S15.

When determining that $0<dS/dt<I_f$ is not satisfied (NO in S5), namely, when determining that the current state is the state in which the charge is performed with the current I greater than or equal to $I_f$, the state in which the discharge is performed (dS/dt<0), or the state of the leaving (dS/dt=0), the controller 41 calculates Dcal (S6). The controller 41 calculates Dcal by the equation (2) using the time dependent degradation coefficient kc stored in the storage 42.

The controller 41 determines whether the ΔSOC ($dS_0$) in the previous state is stored (S7). When determining that $dS_0$ is not stored (NO in S7), the controller 41 advances the processing to S18.

When determining that $dS_0$ is stored (YES in S7), the controller 41 determines whether $dS×dS_0$ is less than or equal to 0 (S8). When determining that $dS×dS_0$ is less than or equal to 0 (YES in S8), the controller 41 determines whether $dS_0$ is not 0 (S9). When determining that $dS_0$ is not 0 (YES in S9), namely, when determining that switching from the charge to the discharge, from the discharge to the charge, or from the charge-discharge to the leaving is performed, the controller 41 acquires the SOC at the start of the charge or the discharge and at the end of the charge or the discharge (S10). The SOC at the end corresponds to the SOC calculated in S2.

When the SOCs at current sampling time $t_2$, previous sampling time $t_1$, and sampling time $t_0$ before the previous sampling time are set to $SOC_2$, $SOC_1$, and $SOC_0$, $dS=ΔSOC_2=SOC_2−SOC_1$, and $dS_0=ΔSOC_1=SOC_1−SOC_0$. In the case of the charge, the ΔSOC is a positive value, and in the case of the discharge, the ΔSOC is a negative value. Thus, when $dS×dS_0$ is negative, it can be determined that the switching from the charge to the discharge or from the discharge to the charge is performed. In the case of dS=0, it can be determined that the charge-discharge is switched to the leaving.

When the controller 41 determines that $dS_0$ is 0 (NO in S9), namely, when the controller 41 determines that the leaving is continued or the leaving is switched to the charge-discharge, the processing proceeds to S14.

The controller 41 calculates the ΔSOC of the difference between the start and the end in the charge or the discharge (S11).

The controller 41 reads a degradation coefficient table 45, and identifies the degradation coefficient kr as described above based on the SOC range from the start to the end and the minimum ΔSOC (S12).

Using the identified degradation coefficient kr and the charge-discharge time t, the controller 41 calculates Dcyc from Dcyc=kr×ΔSOC in the equation (3) (S13).

When the controller 41 determines that $dS×dS_0$ is not less than or equal to 0 (NO in S8), namely, when the controller 41 determines that the charge-discharge is continuous, the processing proceeds to S18.

The controller 41 calculates the degradation amount D (S14). When the current state is the charge or discharge state, the degradation amount D is calculated from D=Dcal+Dcyc of the equation (1). When the current state is the leaving state, the degradation amount D is calculated by D=Dcal of the equation (4).

When determining that $0<dS/dt<I_f$ is satisfied (YES in S5), the controller 41 calculates Dflt (S15).

The controller 41 determines whether $dS_0/dt≥I_f$ or $dS_0/dt<0$ is satisfied (S16).

When the controller 41 determines that $dS_0/dt≥I_f$ or $dS_0/dt<0$ is satisfied (YES in S16), namely, when the controller 41 determines that the charge-discharge is switched to the floating, the processing proceeds to S10, and the degradation amount D is calculated by D=Dcal+Dcyc+Dflt in the equation (5) in S14.

When the controller 41 determines that $dS_0/dt≥I_f$ or $dS_0/dt<0$ is not satisfied (NO in S16), namely, when the controller 41 determines that the floating is continues or the leaving is switched to the floating, the processing proceeds to S14, and the degradation amount D is calculated from D=Dcal+Dflt of the equation (7).

The controller 41 updates the start SOC (S17).

The controller 41 updates the SOC in the current state to the SOC in the previous state (S18), and ends the processing.

Figure 9:
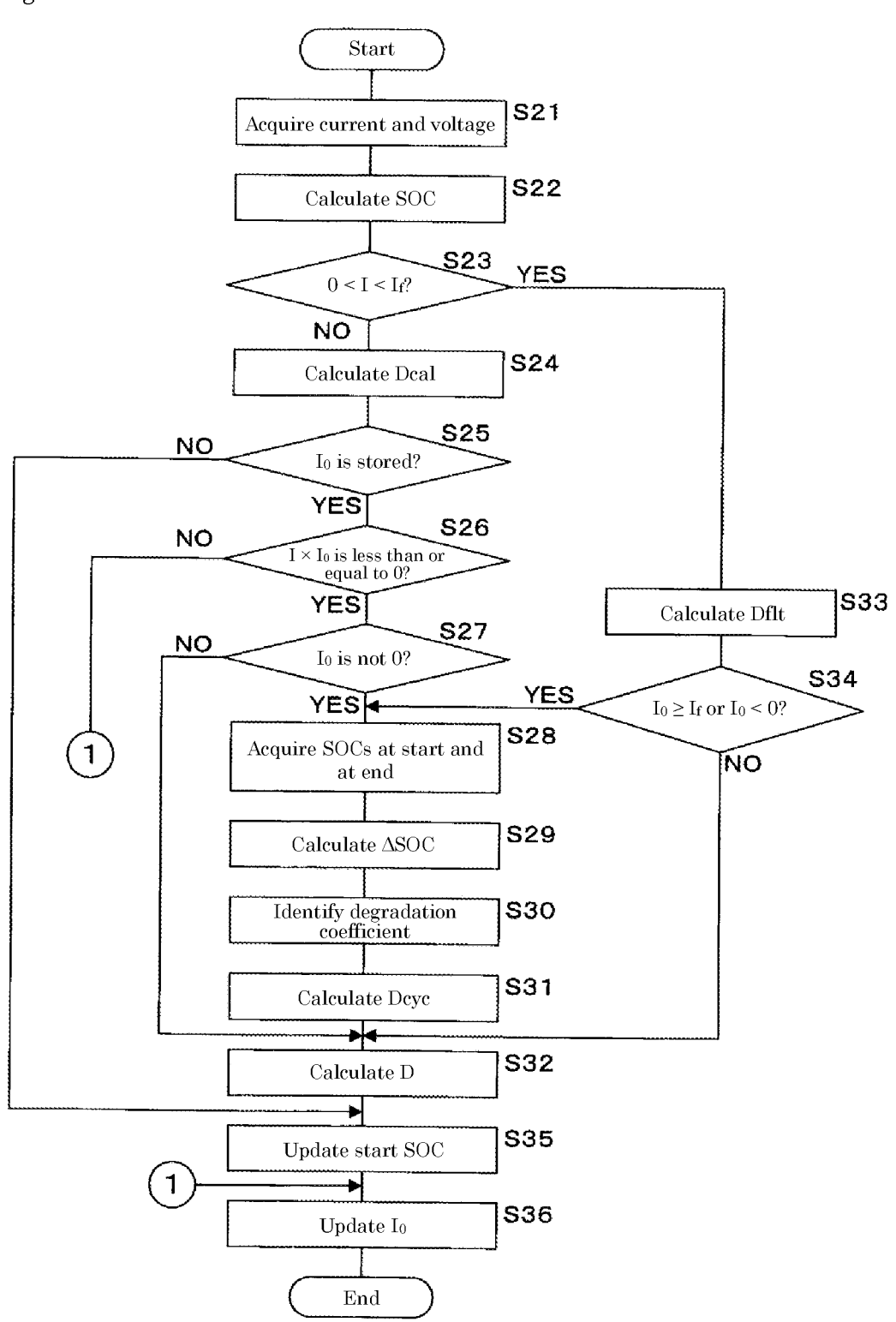
FIG. 9 is a flowchart illustrating another processing procedure of the estimation device estimating degradation of an energy storage device.

FIG. 9 is a flowchart illustrating another processing procedure of the BMU 4 estimating the degradation of the energy storage device.

The controller 41 acquires the current I and the voltage V (S21).

The controller 41 calculates the SOC (S22).

The controller 41 determines whether $0<I<I_f$ (S23). $I_f$ is a current threshold determining whether the floating state is established. When the controller 41 determines that $0<I<I_f$ (YES in S23), the processing proceeds to S33.

When determining that $0<I<I_f$ is not satisfied (NO in S23), namely, when determining that the current state is the state in which the charge is performed with the current I greater than or equal to $I_f$, the state in which the discharge is performed (I<0), or the state in which the battery is left (I=0), the controller 41 calculates Dcal (S24). The controller 41 calculates Dcal by the equation (2) using the time dependent degradation coefficient kc stored in the storage 42.

The controller 41 determines whether $I_0$ of the previous state is stored (S25). When the controller 41 determines that $I_0$ is not stored (NO in S25), the processing proceeds to S35.

When determining that $I_0$ is stored (YES in S25), the controller 41 determines whether $I×I_0$ is less than or equal to 0 (S26). When determining that $I×I_0$ is less than or equal to 0 (YES in S26), the controller 41 determines whether $I_0$ is not 0 (S27). When determining that $I_0$ is not 0 (YES in S27), and when determining that the switching is performed from the charge to the discharge, the discharge to the charge, or the charge-discharge to the leaving, the controller 41 acquires the SOC at the start of the charge or the discharge and at the end of the charge or the discharge (S28).

In the case of the charge, the current is a positive value, and in the case of the discharge, the current is a negative value. Thus, when $I×I_0$ is negative, it can be determined that the switching is performed from the charge to the discharge or from the discharge to the charge. In the case of I=0, it can be determined that the charge-discharge is switched to the leaving.

When the controller 41 determines that $I_0$ is 0 (NO in S27), namely, when the controller 41 determines that the leaving is continued or the leaving is switched to the charge-discharge, the processing proceeds to S32.

The controller 41 calculates ΔSOC of a difference between a start time and an end time in the charge or the discharge (S29).

The controller 41 reads the degradation coefficient table 45, and identifies the degradation coefficient kr as described above based on the SOC range from the start to the end and the minimum ΔSOC (S30).

The controller 41 calculates Dcyc by the equation (3) using the identified degradation coefficient kr and the charge-discharge time t (S31).

When the controller 41 determines that I×$I_0$ is not less than or equal to zero (NO in S26), namely, when the controller 41 determines that the charge-discharge is continuous, the processing proceeds to S36.

The controller 41 calculates the degradation amount D (S32). When the current state is the charge or discharge state, the degradation amount D is calculated from D=Dcal+Dcyc of the equation (1). When the current state is the leaving state, the degradation amount D is calculated by D=Dcal of the equation (4).

When determining that 0<I<$I_f$ (YES in S23), the controller 41 calculates Dflt (S33).

The controller 41 determines whether $I_0 \geq I_f$ or $I_0 < 0$ is satisfied (S34).

When determining that $I_0 \geq I_f$ or $I_0 < 0$ (YES in S34), namely, when determining that the previous state is the charge state or the discharge state, the controller 41 advances the processing to S28, and the degradation amount D is calculated by D=Dcal+Dcyc+Dflt of the equation (5) in S32.

When determining that $I_0 \geq I_f$ or $I_0 < 0$ is not satisfied (NO in S34), namely, when determining that 0<$I_0$<$I_f$ is satisfied, the controller 41 advances the processing to S32, and calculates the degradation amount D by D=Dcal+Dflt of the equation (7).

The controller 41 updates the start SOC (S35).

The controller 41 updates the current I to $I_0$ (S36), and ends the processing.

In the flowchart of FIG. 9, the power is used instead of the current, and the degradation amount can be calculated in the same manner as the case of the current.

In the embodiment, the degradation coefficient kr corresponding to the degradation coefficient kr stored in the storage 42 is identified based on the SOC range from the start to the end of the continuous charge-discharge and the ΔSOC at the start and the end, and the degradation of the battery module 3 is estimated. The degradation is estimated by batch processing using the degradation coefficient kr corresponding to the ΔSOC and the SOC range each time of the charge and the discharge. Even for a complicated charge-discharge pattern in which the charge-discharge is frequently switched, the degradation of the battery module 3 can be accurately estimated.

Figure 10:
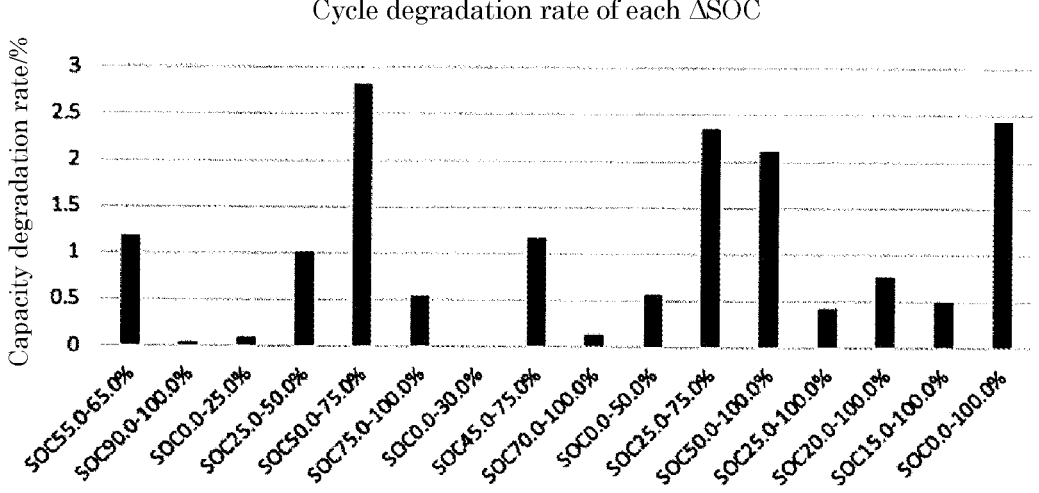
FIG. 10 is a graph illustrating a result of obtaining a degradation amount by processing of the flowchart in FIG. 8 while SOC ranges (start to end) are changed.

FIG. 10 is a graph illustrating a result of obtaining the degradation amount by the processing of the flowchart in FIG. 8 while the SOC ranges (start to end) are changed. The vertical axis represents a capacity degradation rate (%) as the degradation amount.

Figure 11:
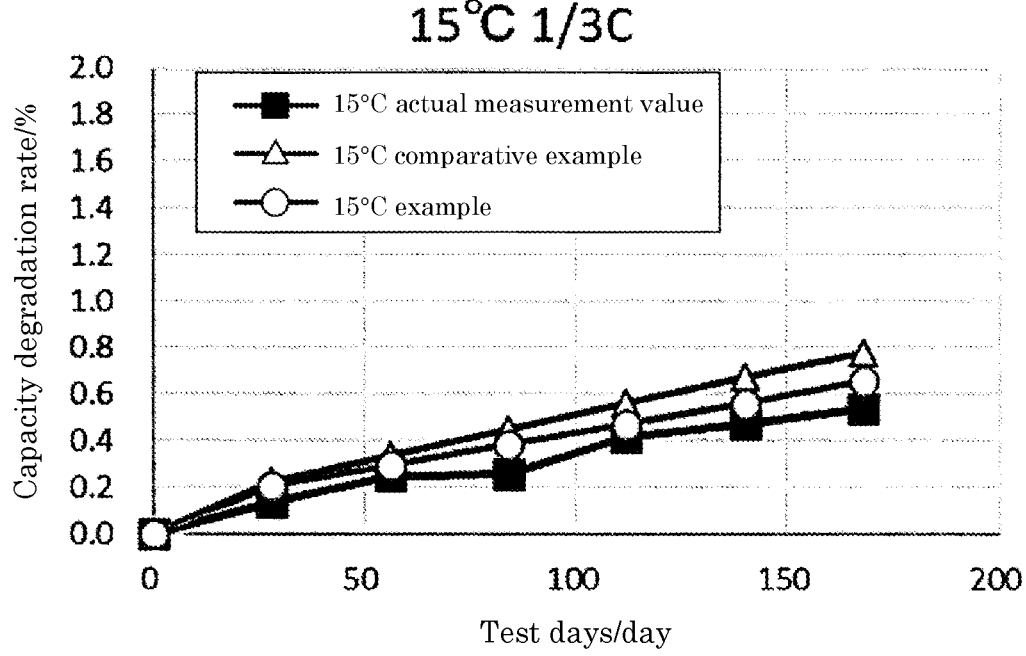
FIG. 11 is a graph illustrating a result of obtaining a relationship between test days and a capacity degradation rate when an energy storage device for a wind power generation facility is simulated at a temperature of 15° C. and a rate of 1/3C to perform charge-discharge.
Figure 12:
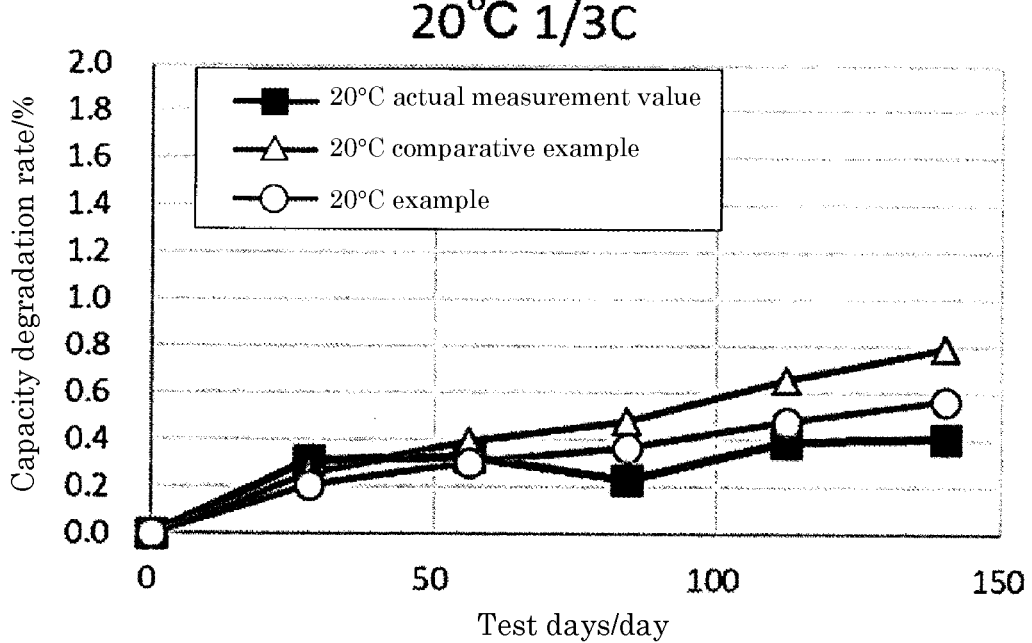
FIG. 12 is a graph illustrating a result of obtaining the relationship between the test days and the capacity degradation rate when the energy storage device for the wind power generation facility is simulated at the temperature of 20° C. and the rate of 1/3C to perform the charge-discharge.
Figure 13:
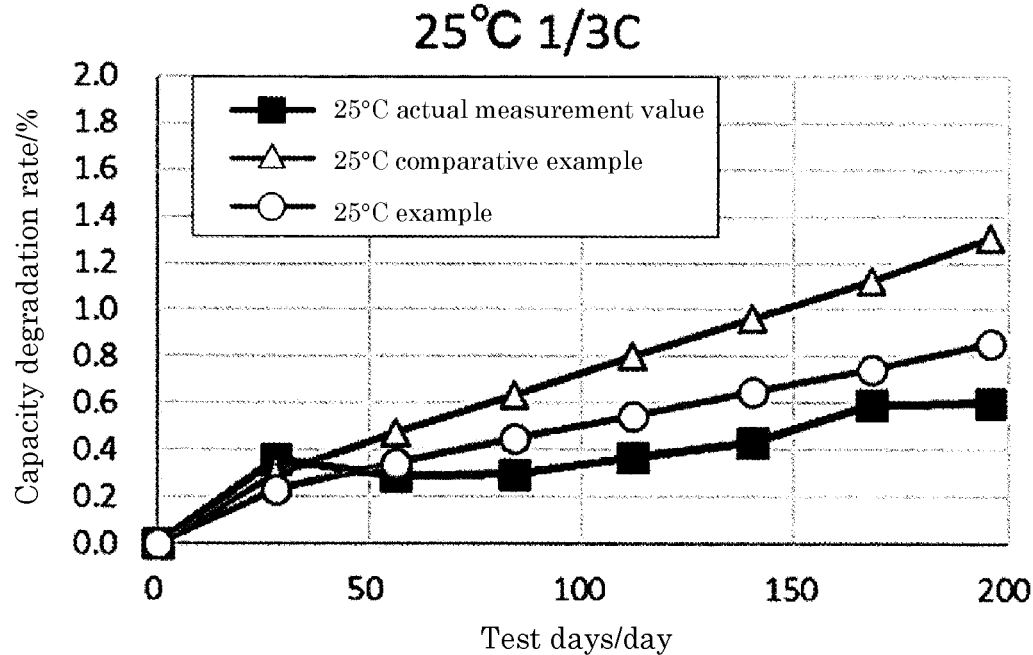
FIG. 13 is a graph illustrating a result of obtaining the relationship between the test days and the capacity degradation rate when the energy storage device for the wind power generation facility is simulated at the temperature of 25° C. and the rate of 1/3C to perform the charge-discharge.
Figure 14:
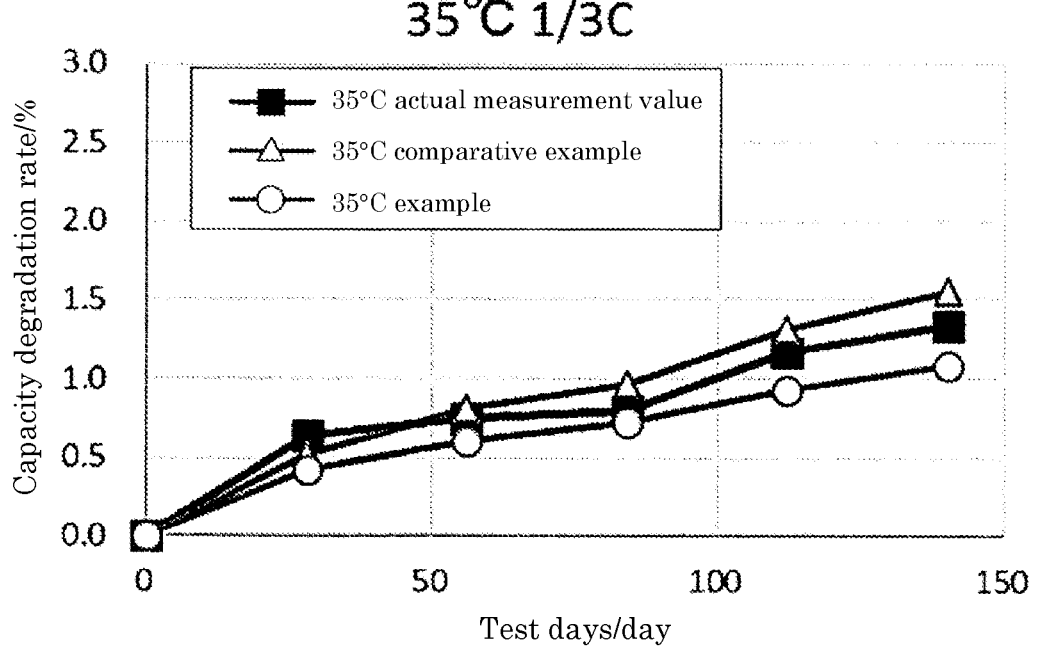
FIG. 14 is a graph illustrating a result of obtaining the relationship between the test days and the capacity degradation rate when the energy storage device for the wind power generation facility is simulated at the temperature of 35° C. and the rate of 1/3C to perform the charge-discharge.
Figure 15:
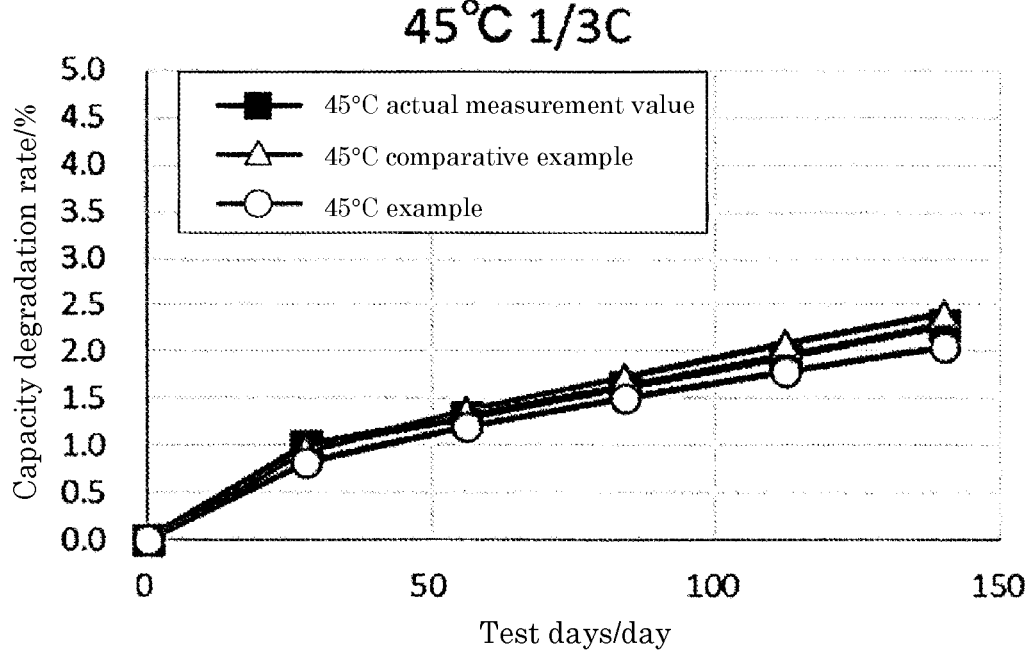
FIG. 15 is a graph illustrating a result of obtaining the relationship between the test days and the capacity degradation rate when the energy storage device for the wind power generation facility is simulated at the temperature of 45° C. and the rate of 1/3C to perform the charge-discharge.
Figure 16:
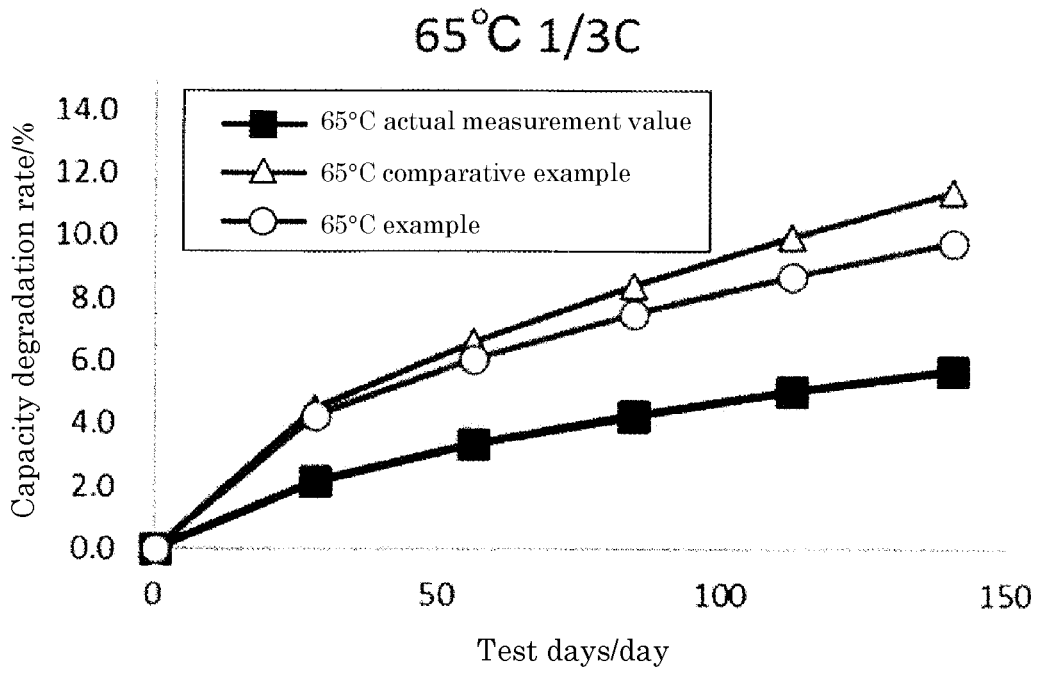
FIG. 16 is a graph illustrating a result of obtaining the relationship between the test days and the capacity degradation rate when the energy storage device for the wind power generation facility is simulated at the temperature of 65° C. and the rate of 1/3C to perform the charge-discharge.

FIG. 11 is a graph illustrating the result of obtaining the relationship between the number of test days and the capacity degradation rate when the energy storage device for the wind power generation facility is simulated at the temperature of 15° C. and the rate of 1/3C to perform the charge-discharge of the battery module 3. The horizontal axis represents the number of test days (day), and the vertical axis represents the capacity degradation rate (%). A graph of an actual measurement value, a graph of a comparative example in which the degradation amount is calculated by the conventional estimation method, and a graph of an example in which the degradation amount is calculated by the estimation method of the embodiment are illustrated in FIG. 11.

FIGS. 12 to 16 are graphs illustrating the results of obtaining the relationship between the number of test days and the capacity degradation rate at the rate of 1/3C in the same manner as in FIG. 11 except that the temperature is changed to 20° C., 25° C., 35° C., 45° C., and 65° C., respectively.

From FIGS. 11 to 16, it can be seen that the accuracy of the estimation is improved in the example as compared with the comparative example.

From the above, it is checked that for the example even in the case of having a plurality of charge-discharge patterns as in the energy storage device used in the wind power generation equipment, the degradation amount can be calculated every time of the charge and the discharge, and the degradation can be well estimated. In consideration of the degradation derived from the active materials of the positive electrode and the negative electrode and the averaging effect, it is possible to accurately estimate the degradation corresponding to the frequent change in charge-discharge, and it is possible to accurately determine the number of energy storage devices replaced after a predetermined period. Resource saving and cost reduction can also be achieved.

The above embodiment is not restrictive. The scope of the present invention is intended to include all modifications within the meaning and scope equivalent to the claims.

For example, the estimation device of the present invention is not limited to the charge-discharge system for wind power generation, but can also be applied to other charge-discharge systems such as an in-vehicle regenerative power storage device, a railway regenerative power storage device, and a solar power generation system.

The energy storage device is not limited to a lithium-ion secondary battery. The energy storage device may be another secondary battery, a primary battery, or an electrochemical cell such as a capacitor.

The invention claimed is:

1. A charge-discharge system of an energy storage device, the charge-discharge system comprising:
   a voltage sensor connected in parallel to the energy storage device;
   a current sensor connected in series to the energy storage device;
   a temperature sensor connected adjacent to the energy storage device; and
   an electronic control unit comprising:
     a controller; and
     a storage that is preloaded with a degradation coefficient table which stores a plurality of degradation coefficients in association with a plurality of state of charge (SOC) ranges obtained by dividing SOCs of 0 to 100% at different intervals and that stores an estimation program which is a computer program,
     wherein the controller is configured to:
       receive detection results of a voltage, a current, and a temperature, the detection results being generated by the voltage sensor, the current sensor, and the temperature sensor, respectively; and
       upon determination that a switching is performed between the charge and discharge and based upon the received detection results:

(i) calculate SOCs at a start and an end in charge, discharge, or floating charge of the energy storage device;

(ii) calculate a change amount of current, voltage, power, or an SOC in a unit time;

(iii) determine presence or absence of switching from leaving to charge, switching from leaving to discharge, or switching between charge-discharge based on the change amount of the current, the voltage, the power, or the SOC presently acquired and the change amount of the current, the voltage, the power, or the SOC previously acquired;

(iv) identify a corresponding degradation coefficient from the degradation coefficient table based on the SOCs acquired at the start and the end; and (v) calculate estimated degradation of the energy storage device based on the degradation coefficient identified, wherein the degradation coefficient identified is of an SOC range including the SOCs acquired at the start and end and having a smallest range width in the plurality of SOC ranges.

2. The charge-discharge system according to claim 1, wherein the controller of the electronic control unit is further configured to calculate the SOC based on the change amount of the current, the voltage, the power, or the SOC presently acquired and the change amount of the current, the voltage, the power, or the SOC previously acquired.

3. The charge-discharge system according to claim 2, wherein the controller of the electronic control unit is further configured to:

determine whether a state is a charge-discharge state, a leaving state, or a floating state based on a change amount of current, voltage, power, or an SOC acquired for a unit time acquired, and estimate the degradation based on the determined state.

4. The charge-discharge system according to claim 1, wherein the controller of the electronic control unit is further configured to determine a number of the energy storage device replaced or added after a predetermined period.

* * * * *